United States Patent [19]
Hirano

[11] Patent Number: 5,814,891
[45] Date of Patent: Sep. 29, 1998

[54] FLIP-CHIP CONNECTING TYPE SEMICONDUCTOR DEVICE

[75] Inventor: Naohiko Hirano, Kawasaki, Japan

[73] Assignee: Kabushiki Kaisha Toshiba, Kawasaki, Japan

[21] Appl. No.: 582,580

[22] Filed: Jan. 3, 1996

[30] Foreign Application Priority Data

Jan. 11, 1995 [JP] Japan .................................... 7-002509

[51] Int. Cl.$^6$ ............................ H01L 23/48; H01L 23/52
[52] U.S. Cl. ..................... 257/778; 257/691; 257/737; 257/773; 257/786
[58] Field of Search ................................. 257/691, 697, 257/773, 778, 786, 737

[56] References Cited

U.S. PATENT DOCUMENTS

| | | | |
|---|---|---|---|
| 4,338,621 | 7/1982 | Braun | 257/697 |
| 4,930,002 | 5/1990 | Takenaka et al. | 257/697 |
| 4,994,902 | 2/1991 | Okahashi et al. | 257/697 |
| 5,089,881 | 2/1992 | Panicker | 257/697 |
| 5,386,129 | 1/1995 | Koizumi | 257/691 |
| 5,440,453 | 8/1995 | Cooke et al. | 257/697 |

*Primary Examiner*—David Ostrowski
*Attorney, Agent, or Firm*—Finnegan, Henderson, Farabow, Garrett & Dunner, L.L.P.

[57] ABSTRACT

A plurality of bumps formed of low melting metal are disposed on the surface of the peripheral portion of a semiconductor substrate. Those bumps which are included in the above bumps and formed on each corner portion of the semiconductor chip are connected to a power supply wiring and a ground wiring used as a power supply wiring. The other bumps disposed in position other than the corner portions are connected to a signal wiring.

23 Claims, 3 Drawing Sheets

FLIP-CHIP CONNECTING TYPE SEMICONDUCTOR DEVICE

BACKGROUND OF THE INVENTION

1. Field of the Invention

This invention relates to a flip-chip connecting type semiconductor device for connecting a semiconductor chip to a substrate while the surface of the semiconductor chip on which active elements are formed is set to face the substrate.

2. Description of the Related Art

For flip-chip connection, a plurality of projecting electrodes (which are hereinafter referred to as bumps) formed of low melting point metal are formed on the surface of a semiconductor chip on which active elements are formed. The surface of the chip on which the bumps are formed is set in a preset position of the substrate, and then the semiconductor chip is connected to the substrate at one time by reflow melting of the bumps. The bumps and substrate are subjected to the heat cycle in which they are heated or cooled according to a variation in the environment temperature. When low melting point metal such as solder alloy containing Pb, Sn as main components is used as the bump, the connecting portions between the bump and the semiconductor chip and between the bump and the substrate get fatigue and are destroyed by the heat cycle. This is considered because the thermal expansion coefficients of the semiconductor chip and the substrate are different. It is known in the art that the fatigue and destruction tend to occur in position apart from the central portion of the semiconductor chip, more precisely, the center of gravity of all of the bumps on the chip, particularly, in the outermost peripheral portion and corner portion of the semiconductor chip in many cases. Therefore, in order to alleviate the influence of the fatigue and destruction, some measures are taken by, for example, removing the bumps lying on the corner portion of the semiconductor chip, arranging dummy bumps which do not electrically function on the corner portion, or making the bumps formed on the corner portion larger than those formed on the other portion.

However, when the above measures are taken and if it is required to miniaturize the semiconductor chip and increase the number of pins, the number of bumps becomes insufficient and there occurs a strong possibility that the bumps on the corner portion must be designed in the same manner as the bumps formed on the other portion. Particularly, since formation of the dummy bumps which do not electrically function only obstructs an increase in the number of pins, it is desirable not to use the dummy bumps. Therefore, it becomes difficult to attain the miniaturization of the semiconductor chip and an increase in the number of pins and at the same time reduce the rate of occurrence of defective bumps so as to attain the long-term reliability of the semiconductor chip.

Further, with an increase in the number of pins in the semiconductor chip, a problem that switching noises are simultaneously generated at a plurality of output terminals is encountered. The switching noise may be generated mainly by the inductance of the wiring for connecting the output terminal of the output buffer circuit to the bump and the inductance of the wiring for connecting the power supply terminal of the output buffer circuit to the bump. Since the switching noise makes the problem more serious when the operation speed of the semiconductor chip is enhanced, it is desired to suppress the switching noise.

SUMMARY OF THE INVENTION

An object of this invention is to provide a semiconductor device capable of stably attaining a necessary number of bumps and suppressing the switching noise to attain the long-term reliability even when the semiconductor chip is miniaturized and the number of pins is increased.

The above object can be attained by a semiconductor device comprising a semiconductor substrate; a power supply wiring disposed in the semiconductor substrate; a signal wiring disposed in the semiconductor substrate; and a plurality of projecting electrodes arranged on the surface of the peripheral portion of the semiconductor substrate, wherein a plurality of electrodes among the above plurality of electrodes which are formed on the corner portion are connected to the power supply wiring and the electrodes formed on a portion other than the corner portion are connected to the signal wiring.

As described before, the projecting electrodes get fatigue and are destroyed in a portion apart from the central portion of the semiconductor substrate, particularly, in the outermost peripheral portion and corner portion of the semiconductor device in many cases. When the electrodes formed in the above portions are used as output terminals of the signal system, particularly, as the output terminal of the clock signal system and if the above electrode is destroyed, the semiconductor will fall into the fatally defective operating condition. Further, even if the electrode is not destroyed but becomes defective, the reliability of the semiconductor element and the system is degraded.

According to this invention, a plurality of electrodes formed on the corner portion of the semiconductor substrate are used as electrodes of the power supply system, and therefore, even if part of the electrodes are destroyed, the remaining electrodes of the power supply system can be used to supply electric power to the semiconductor element, thus making it possible to attain the fail-safe function.

Further, since a plurality of electrodes are used as electrodes of the power supply system, the inductance of the electrodes of the power supply system can be substantially reduced and noises in the power supply system can be suppressed.

The position in which the electrodes of the power supply system are arranged is not limited to the corner portion of the semiconductor substrate and the electrodes of the power supply system may be arranged at least on the outermost peripheral portion.

The electrodes of the signal system are arranged in position other than at least the outermost peripheral portion and corner portion of the semiconductor substrate. Therefore, destruction of the electrodes of the signal system can be prevented by use of electrodes of the same number as and of the same size as in the conventional case, and thus the long-term reliability can be attained and the margin for the reliability can be enlarged.

Further, in comparison with a case wherein the dummy bumps larger than the bumps formed on the other portion are formed on the corner portion of the semiconductor substrate, the number of unnecessary bumps can be reduced and it becomes easier to cope with the miniaturization of the semiconductor substrate and an increase in the number of pins.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

There will now be described embodiments of this invention with reference to the accompanying drawings.

Figure 1:
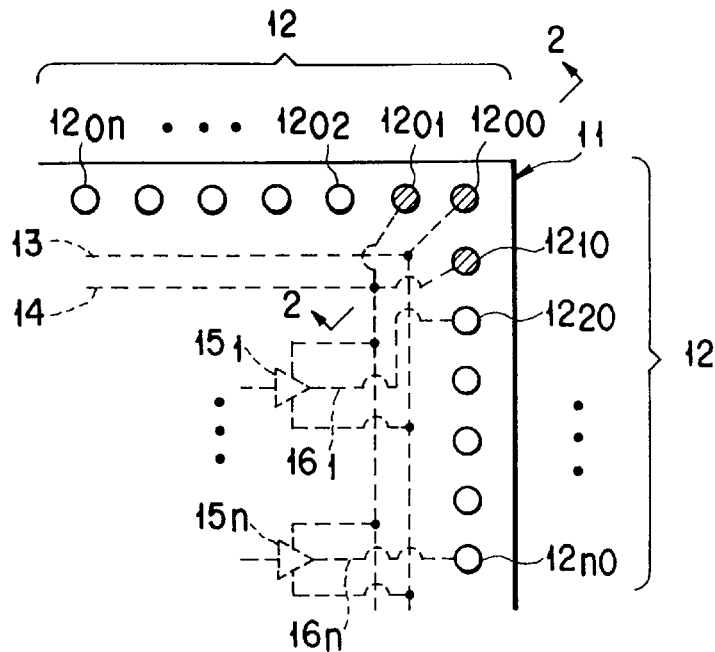
FIG. 1 is a construction view showing the main portion of a first embodiment of this invention.
Figure 2:
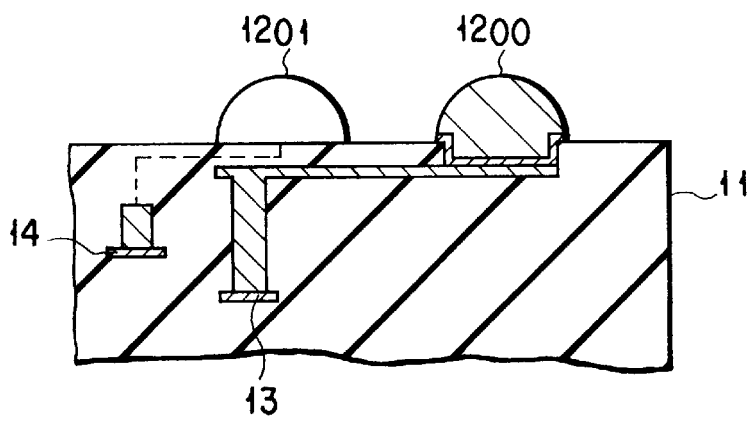
FIG. 2 is a cross sectional view taken along the line 2—2 of FIG. 1.

FIGS. 1 and 2 show a first embodiment of this invention. A plurality of bumps 12 are arranged on the peripheral portion of the surface of a semiconductor substrate (which is hereinafter referred to as a semiconductor chip) 11 on which active elements are formed. For example, the bumps 12 are formed of low melting point metal such as solder alloy containing Pb, Sn as main components. Among the bumps 12, for example, three bumps $12_{00}$, $12_{00}$, $12_{10}$ which are arranged on each of the corner portions of the semiconductor chip 11 are used for the power supply system and the other bumps $12_{02}$ to $12_{0n}$, $12_{20}$ to $12_{n0}$ are used for the signal system (in the drawing, the bumps for the power supply system are hatched). Below the layer in which the bumps $12_{00}$, $12_{01}$, $12_{02}$ to $12_{0n}$, $12_{10}$, $12_{20}$ to $12_{n0}$ are arranged, a ground wiring 13 and power supply wiring 14 supplied with a high potential are arranged along the array of the bumps, for example. That is, the ground wiring 13 and power supply wiring 14 are arranged along the four sides of the semiconductor chip 11. The bump $12_{00}$ is connected to the ground wiring 13, and the bumps $12_{01}$, $12_{10}$ are connected to the power supply wiring 14. That is, the adjacent bumps are not connected to the same wiring and are connected to different wirings. FIGS. 1, 2 show only one corner portion of the semiconductor chip 11, but in practice, bumps arranged on the other three corner portions are used for the power supply system in the same manner as the bumps $12_{00}$, $12_{01}$, $12_{10}$ and selectively connected to the ground wiring 13 and power supply wiring 14.

Further, below the layer in which the bumps 12 are formed, a plurality of output buffer circuits $15_1$ to $15_n$ are formed. The output buffer circuits $15_1$ to $15_n$ output signals supplied from a signal processing circuit (not shown) provided in the semiconductor chip 11, and the power supply terminals of the output buffer circuits $15_1$ to $15_n$ are connected to the power supply wiring 14 and the ground terminals thereof are connected to the ground wiring 13. The output terminals of the output buffer circuits $15_1$ to $15_n$ are respectively connected to the bumps $12_{20}$ to $12_{n0}$ arranged in position other than the corner portion via signal wirings $16_1$ to $16_n$. The bumps $12_{02}$ to $12_{0n}$ are also connected to respective signal wirings (not shown).

The semiconductor chip 11 with the above construction is set such that the surface thereof on which the bumps 12 are formed will be set in position corresponding to a preset position of the mounting substrate (not shown) and then connected to the mounting substrate at one time by reflow melting of the bumps 12.

According to the first embodiment, the three bumps $12_{00}$, $12_{01}$, $12_{10}$ formed on each of the corner portions of the semiconductor chip 11 are used for the power supply system. Therefore, even if part of a plurality of bumps for the power supply system disposed on each corner portion are destroyed, a power supply voltage can be supplied to the semiconductor chip 11 from the remaining bumps for the power supply system so that the semiconductor chip 11 can continuously effect the normal operation and the fail-safe function can be attained.

Further, since the bumps for the signal system are disposed in position other than the corner portion of the semiconductor chip 11, the possibility that the bumps are destroyed is lowered. Therefore, the substantial guarantee period of the reliability can be set longer in comparison with the conventional semiconductor chip in which no attention is paid to the arrangement of the bumps even though bumps of the same number as and of the same size as in the conventional case are used. In addition, if the guarantee period is the same as in the conventional case, a system having a larger margin for the reliability can be obtained.

The ground wiring 13 and power supply wiring 14 are connected to a plurality of bumps. That is, the ground wiring 13 and power supply wiring 14 are connected to the bumps via a plurality of wirings. For this reason, a plurality of inductors are connected in parallel with the power supply terminal and ground terminal of each output buffer circuit. Therefore, the inductances of the power supply terminal and the ground terminal are substantially reduced, and as a result, switching noises generated when each output buffer circuit is operated can be suppressed.

Next, other embodiments of this invention are explained. In these embodiments, portions which are the same as those of the first embodiment are denoted by the same reference numerals. In the drawings of the embodiments, output buffer circuits are omitted.

Figure 3:
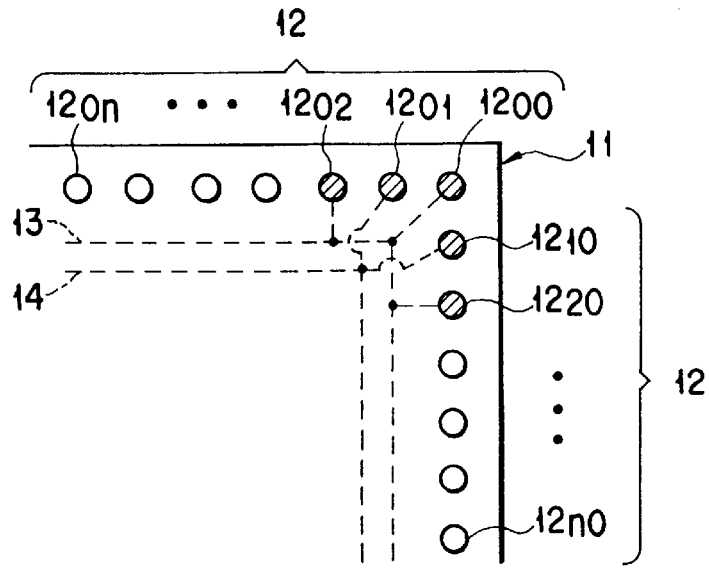
FIG. 3 is a construction view showing the main portion of a second embodiment of this invention.

FIG. 3 shows the second embodiment of this invention. In FIG. 3, the first to at least third bumps counted from each corner of a semiconductor chip 11 in both directions, that is, bumps $12_{00}$, $12_{01}$, $12_{02}$, $12_{10}$ and $12_{20}$ are used for the power supply system and the other bumps are used for the signal system. Below the layer in which the bumps 12 are arranged, for example, a ground wiring 13 and power supply wiring 14 are disposed along the array of the bumps 12. The bumps $12_{00}$, $12_{02}$, $12_{20}$ are connected to the ground wiring 13 and the bumps $12_{01}$, $12_{10}$ are connected to the power supply wiring 14.

Also, in this embodiment, the same effect as in the first embodiment can be attained. In addition, according to the construction of this embodiment, the same effect as that obtained when bumps larger than bumps formed in position other than the corner portion are arranged on the corner portion can be attained, and the number of bumps for the power supply system is larger than in the case of the first embodiment, and therefore, noises in the power supply system can be suppressed.

Figure 4:
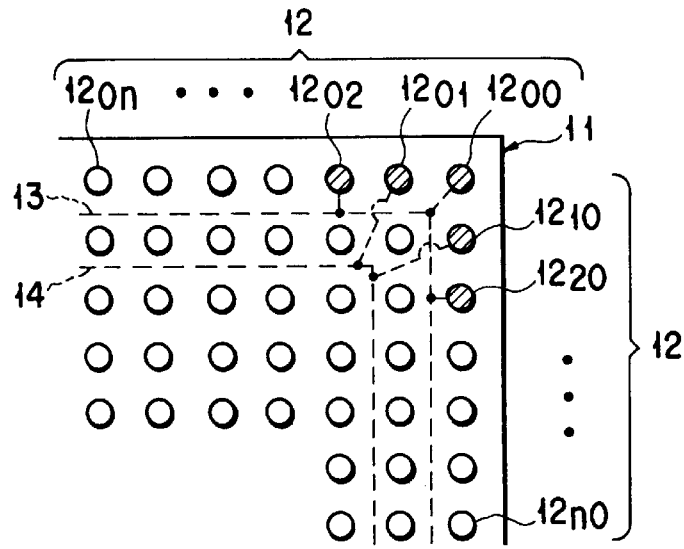
FIG. 4 is a construction view showing the main portion of a third embodiment of this invention.

FIG. 4 shows the third embodiment of this invention and shows a case of a so-called area arrangement in which a plurality of bumps are arranged in a plurality of rows and a plurality of columns. That is, as shown in FIG. 4, a plurality of bumps are arranged at regular intervals on the entire surface of a semiconductor chip 11. Among these bumps, the first to at least third bumps $12_{00}$, $12_{01}$, $12_{02}$, $12_{10}$ and $12_{20}$ counted from the corner of the semiconductor chip 11 in both directions are used for the power supply system and the other bumps are used for the signal system.

According to this embodiment, the same effect as in the second embodiment can be attained in the semiconductor chip having the bumps arranged in an area form.

Figure 5:
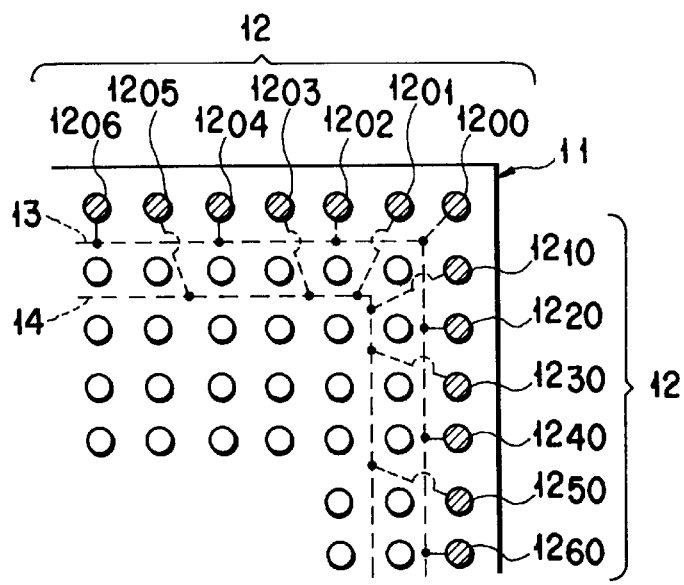
FIG. 5 is a construction view showing the main portion of a fourth embodiment of this invention.

FIG. 5 shows the fourth embodiment of this invention. Like the third embodiment, in this embodiment, bumps are arranged in an area form, and all of the bumps $12_{00}$ to $12_{0n}$, $12_{10}$ to $12_{n0}$ (bumps $12_{0n}$, $12_{n0}$ are not shown) that are arranged on the outermost peripheral portion of a semiconductor chip 11 are used for the power supply system and the bumps which are disposed in position inwardly deviated from the above bumps are used for the signal system.

That is, in FIG. 5, for example, the bumps $12_{00}$, $12_{02}$, $12_{04}$, $12_{06}$, $12_{20}$, $12_{40}$, $12_{60}$ among the bumps lying on the outermost peripheral portion are connected to the ground wiring 13 and the bumps $12_{01}$, $12_{03}$, $12_{05}$, $12_{10}$, $12_{30}$, $12_{50}$ are connected to the power supply wiring 14. The connection between the bumps and the ground wiring 13, power supply wiring 14 is not limited to the above case.

According to the fourth embodiment, since all of the bumps formed on the outermost peripheral portion of the semiconductor chip 11 are used for the power supply system, the fail-safe function can be further enhanced. That is, when the bumps are arranged in an area form, the possibility that not only the bumps arranged on the corner portion of the semiconductor chip 11 but also the bumps arranged on the other peripheral portions will get fatigue and will be destroyed is strong. Therefore, if the bumps arranged on the peripheral portion are used for the signal system, an erroneous operation occurs when the bumps are destroyed, thereby lowering the reliability at the system level. However, in a case wherein all of the bumps arranged on the outermost peripheral portion of the semiconductor chip are used for the power supply system as in this embodiment, the semiconductor chip will not become fatally defective even if some of the bumps arranged on the peripheral portion are destroyed. Therefore, the reliability of the system can be further enhanced.

Further, the wirings for the power supply system can be easily arranged and the length thereof becomes shorter to suppress the noise in the power supply system in comparison with a case wherein the bumps for the power supply system are arranged in position inwardly deviated from the outermost peripheral portion of the semiconductor chip 11.

Figure 6:
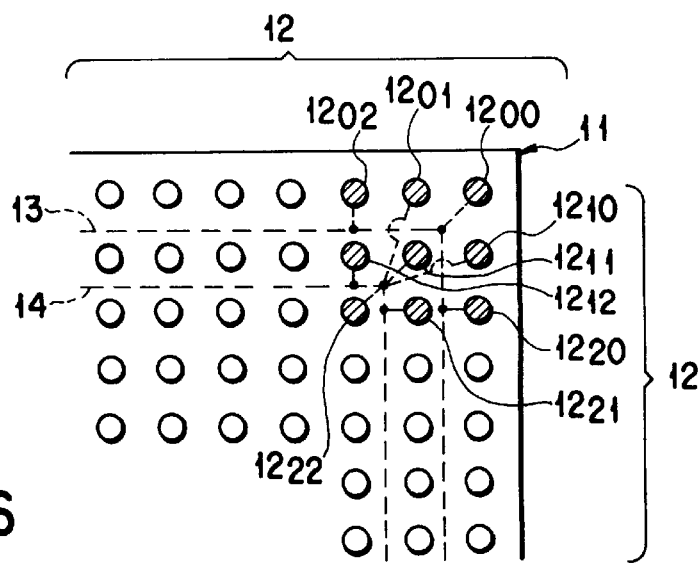
FIG. 6 is a construction view showing the main portion of a fifth embodiment of this invention.

FIG. 6 shows the fifth embodiment of this invention. In this embodiment, at least 3×3 bumps lying on each corner portion of a semiconductor chip 11 and included in a plurality of bumps arranged in an area form are used for the power supply system and the other bumps are used for the signal system.

That is, in FIG. 6, for example, the bumps $12_{00}$, $12_{02}$, $12_{20}$ among the 3×3 bumps $12_{00}$, $12_{01}$, $12_{02}$, $12_{10}$, $12_{11}$, $12_{12}$, $12_{20}$, $12_{21}$, $12_{22}$ lying on the corner portion are connected to a ground wiring 13, and the bumps $12_{01}$, $12_{10}$, $12_{11}$, $12_{12}$, $12_{21}$, $12_{22}$ are connected to a power supply wiring 14.

According to the fifth embodiment, the semiconductor chip is more effective to suppress the influence by the destruction of the bumps in comparison with a case wherein dummy bumps larger than those formed in portions other than the corner portions of the semiconductor chip 11 are formed in each corner portion, and noises in the power supply system can be suppressed since the number of bumps for the power supply system can be made larger than in a case wherein the dummy bumps are used.

Figure 7:
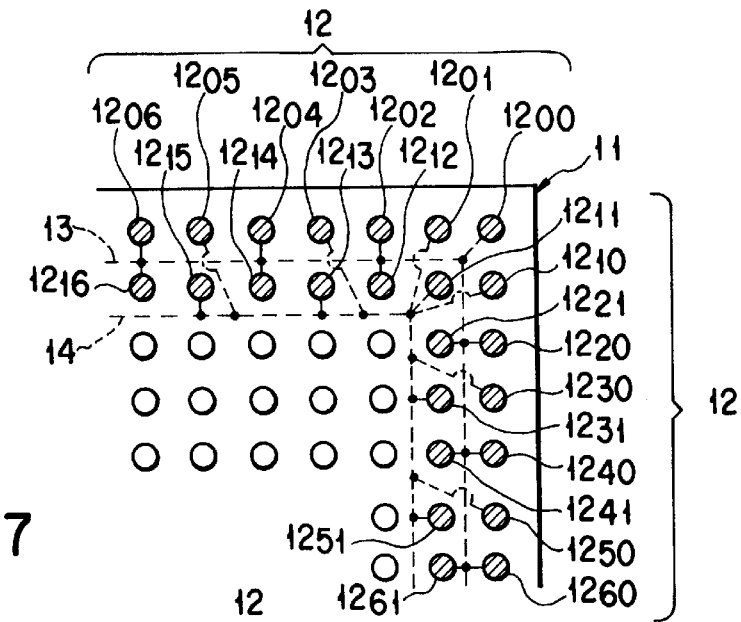
FIG. 7 is a construction view showing the main portion of a sixth embodiment of this invention.

FIG. 7 shows the sixth embodiment of this invention and is a modification of the fourth embodiment. In FIG. 7, portions which are the same as those of FIG. 5 are denoted by the same reference numerals. In the fourth embodiment, all of the bumps arranged on the outermost peripheral portion of the semiconductor chip 11 are used for the power supply system and the bumps arranged in position inwardly deviated from the above bumps are used for the signal system. However, in this embodiment, all of the bumps arranged on the outermost peripheral portion and on the second outermost peripheral portion set in position inwardly deviated from the outermost peripheral portion are used for the power supply system and the other bumps are used for the signal system.

That is, in FIG. 7, for example, the bumps $12_{00}$, $12_{02}$, $12_{04}$, $12_{06}$, $12_{20}$, $12_{40}$, $12_{60}$ among the bumps lying on the outermost peripheral portion are connected to a ground wiring 13, and the bumps $12_{01}$, $12_{03}$, $12_{05}$, $12_{10}$, $12_{30}$, $12_{50}$ are connected to a power supply wiring 14. Further, the bumps $12_{12}$, $12_{14}$, $12_{16}$, $12_{21}$, $12_{41}$, $12_{61}$ among the bumps lying on the second outermost peripheral portion set in position inwardly deviated from the outermost peripheral portion are connected to the ground wiring 13, and the bumps $12_{11}$, $12_{13}$, $12_{15}$, $12_{31}$, $12_{51}$ are connected to the power supply wiring 14.

According to the sixth embodiment, the fail-safe function can be further enhanced in comparison with the fourth embodiment. Further, the length of extension of the wiring for the power supply system on the chip can be made shorter and the wiring can be made easier in comparison with a case wherein the bumps for the power supply system are arranged on the inside portion of the semiconductor chip. Therefore, noise in the power supply system can be suppressed.

Figure 8:
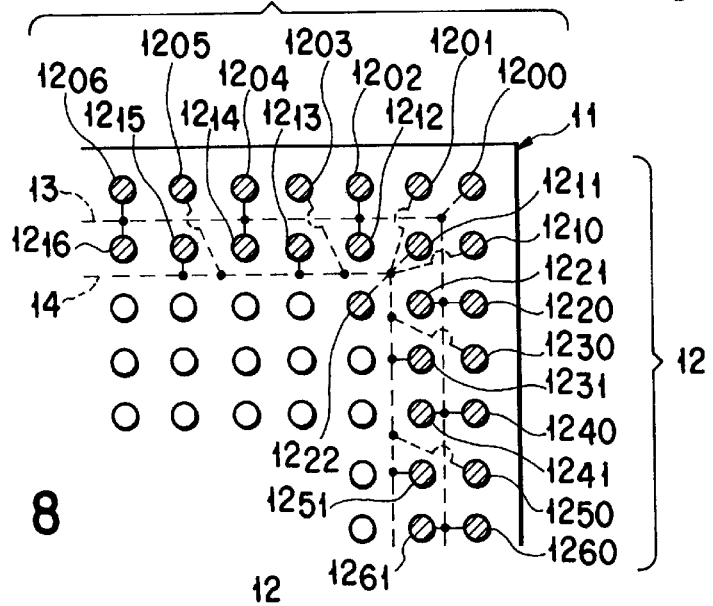
FIG. 8 is a construction view showing the main portion of a seventh embodiment of this invention.

FIG. 8 shows the seventh embodiment of this invention and is a combination of the fifth and sixth embodiments. In FIG. 8, portions which are the same as those of FIGS. 6 and 7 are denoted by the same reference numerals. In this embodiment, 3×3 bumps arranged on the corner portions of the semiconductor chip 11 and all of the bumps arranged on the outermost peripheral portion and second outermost peripheral portion of the semiconductor chip 11 are used for the power supply system and the other bumps are used for the signal system.

According to the seventh embodiment, the fail-safe function can be further enhanced in comparison with the fifth and sixth embodiments, and noise in the power supply system can be suppressed, thereby enhancing the reliability at the system level.

Figure 9:
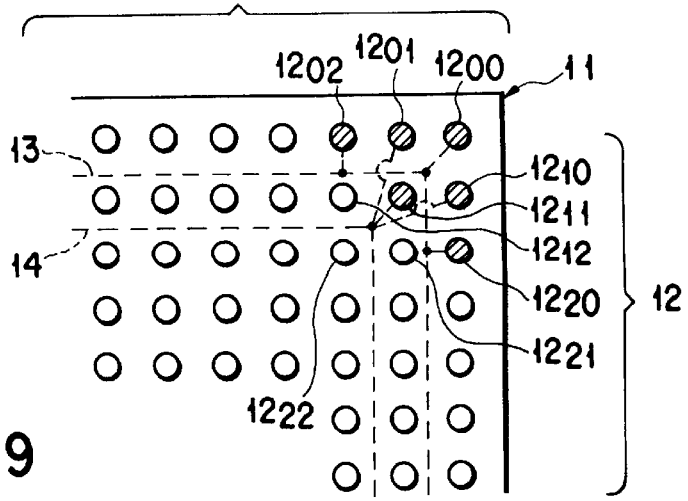
FIG. 9 is a construction view showing the main portion of a eighth embodiment of this invention.

FIG. 9 shows the eighth embodiment of this invention and is a modification of the fifth embodiment. In this embodiment, bumps $12_{00}$, $12_{01}$, $12_{02}$, $12_{10}$, $12_{11}$, $12_{20}$ are used for the power supply system, and the other bumps are used for the signal system. That is, the bumps for the power supply system are arranged on each corner portion of the semiconductor chip 11 in a triangular form with the electrode corresponding to the corner set as the vertex thereof. The bumps $12_{00}$, $12_{02}$, $12_{20}$ are connected to the ground wiring 13, and the bumps $12_{01}$, $12_{10}$, $12_{11}$ are connected to the power supply wiring 14. With the above arrangement, the same effect as in the fifth embodiment can be obtained.

In the first to seventh embodiments, the semiconductor chip may be formed in a square form or rectangular form. Further, whether the bumps used for the power supply system are connected to the ground wiring or power supply wiring may be determined based on the total number of bumps for the power supply system, noise margin, matching with the other circuit wiring, simplicity of the basic design and the like.

For example, the material of the bumps is not limited to a solder metal having an eutectic composition or a composition of Pb:Sn=95%:5%, and a material such as a solder metal containing Pb/Sn as a main component and an additive metal of Ag, Pd, Sb, Bi and the like, or a low melting point metal containing no Pb as the main component of the alloy may be adequately selected according to the application of the semiconductor chip, the long-term reliability, and formation process.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A flip-chip connecting type semiconductor device comprising:

a semiconductor chip on which active elements are formed and which has a peripheral part having a surface and a plurality of corner portions;

a power supply system wiring disposed in said semiconductor chip;

a signal wiring disposed in said semiconductor chip; and a plurality of bumps arranged along the surface of the peripheral part of said semiconductor chip and used for connecting said semiconductor chip to a substrate;

wherein the bumps among said plurality of bumps which are formed on at least one of the corner portions are connected to said power supply system wiring and the bumps formed on the surface of the peripheral part other than the corner portions are connected to said signal wiring.

2. A device according to claim 1, wherein there are at least three bumps connected to said power supply system wiring.

3. A device according to claim 1, wherein said bumps formed on the corner portions are connected in parallel with said power supply wiring to reduce an inductance of said power supply system wiring.

4. A device according to claim 3, wherein said power supply system wiring includes a power supply wiring and a ground wiring, said power supply wiring and ground wiring are arranged along the peripheral part of said semiconductor chip, and adjacent ones of said bumps formed on the corner portions are connected to one of said power supply wiring and ground wiring.

5. A device according to claim 1, wherein said signal wiring is connected to an output terminal of an output buffer circuit.

6. A device according to claim 1, wherein said bumps are each formed of low melting point metal.

7. A flip-chip connecting type semiconductor device comprising:

a semiconductor chip on which active elements are formed and which has a surface including a plurality of corner portions;

a power supply system wiring disposed in said semiconductor chip; and a signal wiring disposed in said semiconductor chip;

a plurality of bumps arranged in row and column directions over the surface of said semiconductor chip and selectively used for connecting said semiconductor chip to a substrate;

wherein the bumps among said plurality of bumps which are formed on at least one of the corner portions are connected to said power supply system wiring and the bumps formed on the surface of a peripheral part other than the corner portions are connected to said signal wiring.

8. A device according to claim 7, wherein the bumps connected to said power supply system wiring are arranged in a matrix pattern of 3×3.

9. A device according to claim 7, wherein the bumps connected to said power supply system wiring are arranged on at least one of the corner portions of said semiconductor chip in a triangular form with one of said bumps corresponding to a corner end of the at least one of the corner portions.

10. A device according to claim 7, wherein said semiconductor chip has an outermost peripheral part and the bumps lying on the outermost peripheral part of said semiconductor chip are all connected to said power supply system wiring.

11. A device according to claim 7, wherein said semiconductor chip has an outermost peripheral part and the bumps lying at least on the outermost peripheral part are all connected to said power supply system wiring.

12. A device according to claim 7, wherein said semiconductor chip has an outermost peripheral part and the bumps lying at least on the outermost peripheral part and at least 3×3 bumps lying in row and column directions on at least one of the corner portions of said semiconductor chip are connected to said power supply system wiring.

13. A device according to claim 7, wherein said bumps lying on the corner portions are connected in parallel with said power supply system wiring to reduce an inductance of said power supply system wiring.

14. A device according to claim 13, wherein said power supply system wiring includes a power supply wiring and a ground wiring, said power supply wiring and ground wiring are arranged along the peripheral part of said semiconductor chip, and adjacent ones of said bumps lying on the corner portions are connected to one of said power supply wiring and ground wiring.

15. A device according to claim 7, wherein said signal wiring is connected to an output terminal of an output buffer circuit.

16. A device according to claim 7, wherein said bumps are each formed of low melting point metal.

17. A flip-chip connecting type semiconductor device comprising:

a semiconductor chip on which active elements are formed and which has a surface including a plurality of corner portions;

a first power supply wiring disposed in said semiconductor chip;

a second power supply wiring disposed in said semiconductor chip;

a signal wiring disposed in said semiconductor chip;

a first bump group of a plurality of bumps arranged on the surface of at least one of the corner portions of said semiconductor chip and used for connecting said semiconductor chip to a substrate, the bumps included in said first group being alternately connected to said first and second power supply wirings; and a second bump group of a plurality of bumps arranged on the surface of other than the corner portions of said semiconductor chip, the bumps of said second bump group being connected to said signal wiring.

18. A device according to claim 17, wherein there are at least three bumps connected to said first and second power supply wiring.

19. A device according to claim 17, wherein the bumps of said first bump group are arranged in a matrix pattern of 3×3.

20. A device according to claim 17, wherein the bumps of said first bump group are arranged on at least one of the corner portions of said semiconductor chip in a triangular form with one of said bumps corresponding to a corner end of the at least one of the corner portions.

21. A device according to claim 17, wherein said signal wiring is connected to an output terminal of an output buffer circuit.

22. A device according to claim 17, wherein the bumps of said first and second bump groups are each formed of low melting point metal.

23. A device according to claim 17, wherein said first power supply wiring is a ground wiring, said second power supply wiring is a high potential wiring, said first and second power supply wiring are arranged along a peripheral part of said semiconductor chip, and adjacent ones of said bumps lying on the corner portions are connected to one of said first and second power supply wirings.

* * * * *